(12) United States Patent
Kamakura et al.

(10) Patent No.: US 11,634,611 B2
(45) Date of Patent: *Apr. 25, 2023

(54) SHEET AND COMPOSITE SHEET

(71) Applicant: NITTO DENKO CORPORATION, Ibaraki (JP)

(72) Inventors: Nao Kamakura, Ibaraki (JP); Yuki Sugo, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/763,408

(22) PCT Filed: Sep. 28, 2016

(86) PCT No.: PCT/JP2016/078667
§ 371 (c)(1),
(2) Date: Mar. 26, 2018

(87) PCT Pub. No.: WO2017/057485
PCT Pub. Date: Apr. 6, 2017

(65) Prior Publication Data
US 2018/0273808 A1    Sep. 27, 2018

(30) Foreign Application Priority Data

Sep. 30, 2015  (JP) .............................. JP2015-193218
Sep. 21, 2016  (JP) .............................. JP2016-184083

(51) Int. Cl.
| B32B 5/16 | (2006.01) |
| C09J 7/28 | (2018.01) |
| C09J 9/02 | (2006.01) |
| C09J 7/10 | (2018.01) |
| C09J 1/00 | (2006.01) |
| C09J 7/20 | (2018.01) |
| H01L 21/52 | (2006.01) |
| C08K 3/10 | (2018.01) |
| C09J 7/00 | (2018.01) |
| C08K 3/08 | (2006.01) |
| B32B 9/00 | (2006.01) |
| C09J 7/25 | (2018.01) |
| C09J 7/24 | (2018.01) |
| C09J 11/04 | (2006.01) |
| H01L 21/683 | (2006.01) |
| H01L 23/00 | (2006.01) |
| C08K 3/22 | (2006.01) |

(52) U.S. Cl.
CPC  *C09J 7/28* (2018.01); *B32B 9/00* (2013.01);
*C08K 3/08* (2013.01); *C08K 3/10* (2013.01);
*C09J 1/00* (2013.01); *C09J 7/00* (2013.01);
*C09J 7/10* (2018.01); *C09J 7/20* (2018.01);
*C09J 7/24* (2018.01); *C09J 7/25* (2018.01);
*C09J 9/02* (2013.01); *C09J 11/04* (2013.01);
*H01L 21/52* (2013.01); *H01L 21/6836*
(2013.01); *H01L 24/29* (2013.01); *H01L 24/73*
(2013.01); *H01L 24/83* (2013.01); *C08K
2003/085* (2013.01); *C08K 2003/0806*
(2013.01); *C08K 2003/2248* (2013.01); *C08K
2003/2286* (2013.01); *C08K 2201/001*
(2013.01); *C09J 2203/326* (2013.01); *C09J
2301/314* (2020.08); *C09J 2301/408*
(2020.08); *C09J 2400/16* (2013.01); *C09J
2433/00* (2013.01); *C09J 2469/00* (2013.01);
*H01L 2221/68327* (2013.01); *H01L 2224/27*
(2013.01); *H01L 2224/29239* (2013.01); *H01L
2224/29247* (2013.01); *H01L 2224/29286*
(2013.01); *H01L 2224/48227* (2013.01); *H01L
2224/73265* (2013.01); *H01L 2224/8384*
(2013.01); *H01L 2224/83191* (2013.01); *H01L
2924/1033* (2013.01); *H01L 2924/10253*
(2013.01); *H01L 2924/10272* (2013.01); *H01L
2924/181* (2013.01)

(58) Field of Classification Search
None
See application file for complete search history.

(56) References Cited

U.S. PATENT DOCUMENTS

| 5,413,691 A | 5/1995 | Kaneyasu et al. |
| 2001/0014492 A1 | 8/2001 | Noguchi et al. |
| 2007/0000595 A1 | 1/2007 | Prack |
| 2007/0141288 A1 | 6/2007 | Hongo et al. |

(Continued)

FOREIGN PATENT DOCUMENTS

| CN | 101065204 A | 10/2007 |
| CN | 101184614 A | 5/2008 |

(Continued)

OTHER PUBLICATIONS

Depositor supplied synonyms of "alpha-terpineol" from PubChem database, retrieved on Jan. 21, 2021, pp. 1-3 (Year: 2021).*

(Continued)

Primary Examiner — Anish P Desai
(74) Attorney, Agent, or Firm — Alleman Hall Creasman & Tuttle LLP

(57) ABSTRACT

A problem is to provide a sheet having a pre-sintering layer, the thickness of which following sintering is such as to be capable of relieving stresses. Solution means relate to a sheet comprising a pre-sintering layer. Viscosity at 90° C. of the pre-sintering layer is not less than 0.27 MPa·s. Thickness of the pre-sintering layer is 30 µm to 200 µm.

21 Claims, 2 Drawing Sheets

(56) References Cited

U.S. PATENT DOCUMENTS

| | | | |
|---|---|---|---|
| 2008/0035244 A1 | 2/2008 | Suzuki et al. | |
| 2008/0311349 A1 | 12/2008 | Johnson et al. | |
| 2010/0006998 A1 | 1/2010 | Masuda et al. | |
| 2011/0171410 A1 | 7/2011 | Nakagawa et al. | |
| 2012/0114927 A1* | 5/2012 | Khaselev | H01L 24/27 428/220 |
| 2012/0177897 A1 | 7/2012 | Jablonski et al. | |
| 2012/0251381 A1 | 10/2012 | Bedworth et al. | |
| 2014/0008588 A1 | 1/2014 | Fujimoto et al. | |
| 2014/0216798 A1 | 8/2014 | Kawato et al. | |
| 2014/0231983 A1* | 8/2014 | Sugo | H01L 21/50 257/734 |
| 2015/0024211 A1 | 1/2015 | Miratsu et al. | |
| 2015/0353804 A1 | 12/2015 | Ghosal et al. | |
| 2016/0136763 A1 | 5/2016 | Endoh et al. | |
| 2016/0254243 A1 | 9/2016 | Kurita et al. | |
| 2018/0030203 A1* | 2/2018 | Nakano | C08G 64/0208 |
| 2018/0056449 A1* | 3/2018 | Zhu | B23K 35/3006 |
| 2018/0257142 A1* | 9/2018 | Kamakura | B22F 1/0059 |

FOREIGN PATENT DOCUMENTS

| | | | | |
|---|---|---|---|---|
| CN | 101772831 A | 7/2010 | | |
| CN | 102051137 A | 5/2011 | | |
| CN | 102510783 A | 6/2012 | | |
| CN | 103992755 A | 8/2014 | | |
| CN | 104212369 A | 12/2014 | | |
| EP | 2770032 A2 | 2/2014 | | |
| EP | 2960930 A1 | 12/2015 | | |
| EP | 3239258 A1 | 11/2017 | | |
| JP | 2002030306 A | 1/2002 | | |
| JP | 2005506901 A | 3/2005 | | |
| JP | 2010254763 A | 11/2010 | | |
| JP | 20154105 A | 1/2015 | | |
| JP | 201579650 A | 4/2015 | | |
| JP | 2015103649 A | 6/2015 | | |
| TW | 201629455 A | 8/2016 | | |
| WO | 03035279 A1 | 5/2003 | | |
| WO | 2012128028 A1 | 9/2012 | | |
| WO | 2014068299 A1 | 5/2014 | | |
| WO | 2014108518 A1 | 7/2014 | | |
| WO | 2014129626 A1 | 8/2014 | | |
| WO | WO-2014184641 A2 * | 11/2014 | | B23K 35/362 |
| WO | 2015034579 A1 | 3/2015 | | |
| WO | 2015060346 A1 | 4/2015 | | |
| WO | 2016139831 A1 | 9/2016 | | |
| WO | 2016182663 A1 | 11/2016 | | |
| WO | WO-2016182663 A1 * | 11/2016 | | B23K 35/3033 |

OTHER PUBLICATIONS

ISA Japan Patent Office, International Search Report Issued in PCT Application No. PCT/JP2016/078667, dated Dec. 13, 2016, WIPO, 4 pages. (Submitted with English Translation of International Search Report).
European Patent Office, Supplemental European Search Report Issued in Application No. 16851656.5, dated Jul. 17, 2018, Germany, 9 pages.
Vick, L. et al., "Pressureless Sintering of Polycarbonate Powder Compacted at Ambient Temperature," Polymer Engineering and Science, Dec. 1998, vol. 38, No. 12, 12 pages.
ISA Japan Patent Office, International Search Report Issued in PCT Application No. PCT/JP2016/077833, dated Dec. 20, 2016, WIPO, 2 pages. (Submitted with English Translation of International Search Report).
International Bureau of WIPO, International Preliminary Report on Patentability Issued in Application No. PCT/JP2016/077833, dated Apr. 12, 2018, WIPO, 7 pages.
European Patent Office, Extended European Search Report Issued in Application No. 16851301.8, dated Nov. 15, 2018, 7 pages.
International Bureau of WIPO, International Preliminary Report of Patentability Issued in Application No. PCT/JP2016/078667, dated Apr. 12, 2018, WIPO, 6 pages.
State Intellectual Property Office of the People's Republic of China, Office Action and Search Report Issued in Application No. 201680058259.9, dated Apr. 26, 2019, 12 pages.
Technical data sheet of poly(propylene carbonate) QPAC 40, Empower Materials, available as early as Mar. 31, 2019 2 pages.
Nakamoto, M., "Fine Electronic Circuit Pattern Formation on the Plastic Substrates by Metal Nanoparticle Pastes," Journal of the Japan Welding Society, vol. 76, No. 3, pp. 167-171, 2007, 5 pages. (see Remarks section of non-final Office action response submitted herewith for explanation of relevance).
Taiwan Intellectual Property Office, Office Action and Search Report Issued in Application No. 105131686, dated Aug. 2, 2019, 11 pages.
Japan Patent Office, Office Action Issued in Application No. 2015-193244, dated Aug. 30, 2019, 6 pages.
Japan Patent Office, Office Action Issued in Application No. 2015-193244, dated Mar. 25, 2020, 8 pages.
European Patent Office, Office Action Issued in Application No. 16851656.5, dated May 13, 2020, Germany, 5 pages.
China National Intellectual Property Administration, Office Action and Search Report Issued in Application No. 201680058259.9, dated Dec. 24, 2019, 10 pages.
Taiwan Intellectual Property Office, Office Action and Search Report Issued in Application No. 105131681, dated Jan. 20, 2020, 11 pages.
China National Intellectual Property Administration, Office Action and Search Report Issued in Application No. 201680058259.9, dated Jun. 22, 2020, 18 pages.
China National Intellectual Property Administration, Office Action and Search Report Issued in Application No. 201680058243.8, dated Aug. 5, 2020, 13 pages.
Japan Patent Office, Reconsideration Report by Examiner before Appeal Issued in Application No. 2015-193244, dated Sep. 8, 2020, 9 pages.
European Patent Office, Office Action Issued in Application No. 16851301.8, dated Sep. 29, 2020, Germany, 6 pages.
"Terpineol" information sheet, GESTIS Substance Database, Institute for Occupational Safety and Health of the German Social Accidental Insurance, Retrieved on Oct. 22, 2020.
China National Intellectual Property Administration, Office Action and Search Report Issued in Application No. 201680058243.8, dated Mar. 25, 2021, 11 pages.
European Patent Office, Office Action Issued in Application No. 16851301.8, dated Nov. 2, 2021, Netherlands, 9 pages.
European Patent Office, Office Action Issued in Application No. 16851301.8, dated Sep. 1, 2022, Netherlands, 9 pages.

* cited by examiner

SHEET AND COMPOSITE SHEET

TECHNICAL FIELD

The present invention relates to a sheet and to a composite sheet.

BACKGROUND ART

There are situations in which chips are secured to substrate using an electrically conductive adhesive not having a property permitting formation of a sintered body at a low temperature of, for example, 300° C. However, there are cases in which it is not possible to ensure prescribed reliability—e.g., reliability as evaluated by temperature cycling testing—of power modules employing such electrically conductive adhesives.

On the other hand, a bonding agent comprising nano-sized metal particles may permit formation of a sintered body at low temperature. Patent Reference No. 1, for example, discloses art in which a substrate is coated with a paste comprising silver microparticles for which the average particle diameter of primary particles is 1 nm to 50 nm, the paste is dried, and sintering is carried out.

PRIOR ART REFERENCES

Patent References

Patent Reference No. 1: Japanese Patent Application Publication Kokai No. 2015-4105

SUMMARY OF INVENTION

Problem to be Solved by Invention

Because the bonding agent described at Patent Reference No. 1 is a paste, in order to form a joint between the substrate and the chip, it is necessary that the substrate be coated with the paste and that the solvent in the paste be volatilized prior to sintering. If sintering were carried out without the solvent having been volatilized, this would cause the paste to flow, resulting in a large decrease in thickness during sintering. Decrease in thickness of the sintered body can lead to decrease in reliability as evaluated by temperature cycling testing. This is because when thickness is too small, the sintered body becomes incapable of relieving stresses produced by variation in temperature.

And if viscosity of the paste is increased in an attempt to eliminate the operation in which the solvent is volatilized, this will make it difficult to coat the substrate with the paste.

There is a possibility that the sintered body resulting from the paste described at Patent Reference No. 1 will have defects resulting from nonuniformity in drying. This is because the paste comprises a large amount of solvent. Defects resulting from nonuniformity in drying can lead to decrease in reliability.

It is an object of the present invention to provide a pre-sintering layer, the thickness of which following sintering is such as to be capable of relieving stresses. It is also an object of the present invention to provide a sheet having a pre-sintering layer. It is also an object of the present invention to provide a composite sheet having a pre-sintering layer.

Means for Solving Problem

The present invention relates to a sheet comprising a pre-sintering layer. Viscosity at 90° C. of the pre-sintering layer is not less than 0.27 MPa·s. Because this is not less than 0.27 MPa·s, there is little reduction in thickness as a result of sintering. Thickness of the pre-sintering layer is 30 μm to 200 μm. Because this is not less than 30 μm, thickness following sintering—sintered body thickness—will be such as to be capable of relieving stresses.

The present invention also relates to a composite sheet. The composite sheet may comprise a release liner, a pre-sintering layer arranged over the release liner, and a dicing sheet arranged over the pre-sintering layer.

The present invention also relates to a power module manufacturing method. A power module manufacturing method in accordance with the present invention comprises an Operation (a) in which a sheet, which comprises a dicing sheet and a pre-sintering layer arranged over the dicing sheet, is affixed to a semiconductor wafer. A power module manufacturing method in accordance with the present invention further comprises an Operation (b) in which pre-sintering chip(s), each of which comprises a semiconductor chip and pre-sintering film arranged over the semiconductor chip, are formed as a result of dicing following Operation (a). A power module manufacturing method in accordance with the present invention further comprises an Operation (c) in which pre-sintering chip(s) are compression-bonded to bonding target(s), and an Operation (d) in which sintering of pre-sintering film is carried out following Operation (c).

EMBODIMENTS FOR CARRYING OUT INVENTION

Although the present invention is described in detail below in terms of embodiments, it should be understood that the present invention is not limited only to these embodiments.

Embodiment 1

—Composite Sheet 1—

Figure 1:
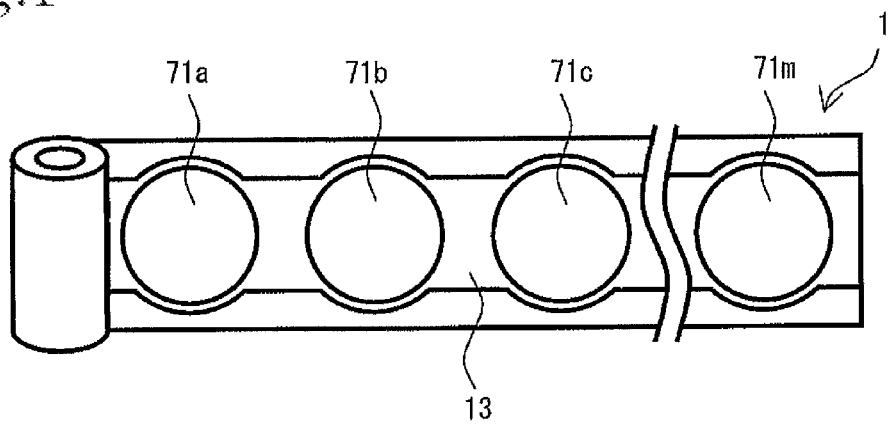
FIG. 1 Schematic plan view of a composite sheet.

As shown in FIG. 1, composite sheet 1 is in the form of a roll. Composite sheet 1 comprises release liner 13 and sheets 71a, 71b, 71c, . . . , 71m (hereinafter collectively referred to as "sheets 71") disposed on release liner 13. The distance between sheet 71a and sheet 71b, the distance between sheet 71b and sheet 71c, and the distance between sheet 71l and sheet 71m, is constant.

Figure 2:
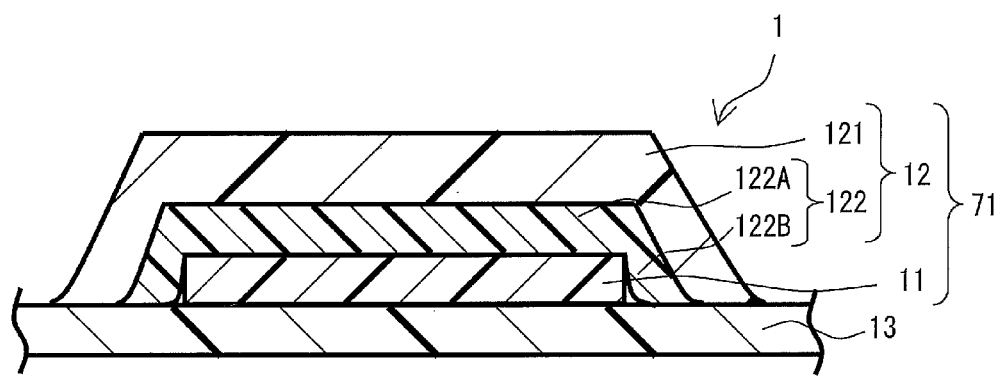
FIG. 2 Schematic sectional diagram of a portion of a composite sheet.

As shown in FIG. 2, sheet 71 comprises pre-sintering layer 11. Sheet 71 further comprises dicing sheet 12 arranged over pre-sintering layer 11. Dicing sheet 12 comprises base 121 and adhesive layer 122 arranged over base 121. The two faces of pre-sintering layer 11 may be defined such that there is a first principal plane that is in contact with adhesive layer 122 and a second principal plane that is opposite the first principal plane. The second principal plane is in contact with release liner 13. Sheet 71 is good in terms of ease of operations. This is because pre-sintering layer 11 and dicing sheet 12 constitute an integral structure from the outset.

Adhesive layer 122 comprises first portion 122A. First portion 122A is cured. First portion 122A is in contact with pre-sintering layer 11. Adhesive layer 122 further comprises second portion 122B arranged peripherally with respect to first portion 122A. Second portion 122B has a property such that it may be cured by means of an energy beam. As energy beam, ultraviolet beams and the like may be cited as examples. Second portion 122B is not in contact with pre-sintering layer 11.

Pre-sintering layer 11 has a property such that it may be made into a sintered body through application of heat. Pre-sintering layer 11 may be used to form a joint between a first object and a second object. This might, for example, be a joint between a chip and a substrate. The base may comprise an insulator base and a conductor layer arranged over the insulator base. As insulator base, ceramic bases and so forth may be cited as examples.

Because it allows thickness to be adjusted by means of lamination, pre-sintering layer 11 is of more uniform thickness than would be the case with a layer formed from a paste. Because pre-sintering layer 11 is in the form of a sheet, operations that would be essential for a paste—printing and drying—can be eliminated.

Thickness of pre-sintering layer 11 is not less than 30 μm, and is preferably not less than 40 μm. Because this is not less than 30 μm, its thickness following sintering will be such as to be capable of relieving stresses. Thickness of pre-sintering layer 11 is not greater than 200 μm, is preferably not greater than 150 μm, and is more preferably not greater than 100 μm.

Viscosity at 90° C. of pre-sintering layer 11 is not less than 0.27 MPa·s, and is preferably not less than 0.5 MPa·s. Because this is not less than 0.27 MPa·s, there is little reduction in thickness as a result of sintering. The upper limit of the range in values for the viscosity at 90° C. of pre-sintering layer 11 might, for example, be 15 MPa·s, 10 MPa·s, or 8 MPa·s. Viscosity at 90° C. of pre-sintering layer 11 varies primarily as a function of the type(s) of binder(s) employed and the amount(s) of such binder(s) present therein.

It is preferred that thickness of the sintered body be 40% to 80% where thickness of the pre-sintering layer 11 is taken to be 100%. A pre-sintering laminated body having a substrate, chip, and a pre-sintering layer 11 sandwiched between the substrate and the chip is heated under the following Condition 1 to cause pre-sintering layer 11 to become a sintered body, following which thickness of the sintered body is measured.

Condition 1 A flat press is used to apply a pressure of 10 MPa to the pre-sintering laminated body as temperature is increased 1.5° C./second from 80° C. to 300° C., and to apply a pressure of 10 MPa as this is maintained at 300° C. for 2.5 minutes.

Pre-sintering layer 11 comprises a binder having a property such that it undergoes pyrolysis when sintered (hereinafter "pyrolizable binder"). For example, this may be a property such that carbon concentration is not greater than 15 wt % following an increase in temperature from 23° C. to 400° C. at a temperature rise rate of 10° C./min in air. Carbon concentration may be measured by means of energy dispersive x-ray analysis. It is preferred that the pyrolizable binder be solid at 23° C. If this is solid at 23° C., it will facilitate molding of pre-sintering layer 11.

The pyrolizable binder might, for example, be polycarbonate, acrylic polymer, ethyl cellulose, polyvinyl alcohol, and/or the like. Pre-sintering layer 11 may comprise a single type of pyrolizable binder or it may comprise two or more types thereof. Of these, acrylic polymer and polycarbonate are preferred, and polycarbonate is more preferred.

It is preferred that the weight-average molecular weight of polycarbonate be not less than 10,000, more preferred that this be not less than 30,000, and still more preferred that this be not less than 50,000. It is preferred that the weight-average molecular weight of polycarbonate be not greater than 1,000,000, more preferred that this be not greater than 500,000, and still more preferred that this be not greater than 350,000. Weight-average molecular weight is measured using GPC (gel permeation chromatography) and is expressed as the polystyrene equivalent value.

The polycarbonate might, for example, be aliphatic polycarbonate. It is preferred that the aliphatic polycarbonate be such that there are no aromatic compounds (e.g., benzene rings) between carbonate ester (—O—CO—O—) groups in the main chain. It is preferred that the aliphatic polycarbonate be such that there is/are aliphatic chain(s) between carbonate ester groups in the main chain. The aliphatic polycarbonate might, for example, be polypropylene carbonate, polyethylene carbonate, or tert-polybutyl ethylene carbonate. Of these, polypropylene carbonate is preferred. This is because it will effectively undergo pyrolysis when sintered.

For every 100 wt % of pre-sintering layer 11, it is preferred that pyrolizable binder be present in an amount that is not less than 0.5 wt %, more preferred that this be not less than 1 wt %, and still more preferred that this be not less than 2 wt %. For every 100 wt % of pre-sintering layer 11 it is preferred that pyrolizable binder be present in an amount that is not greater than 20 wt %, more preferred that this be not greater than 15 wt %, and still more preferred that this be not greater than 10 wt %.

Pre-sintering layer 11 comprises metal particles. These might be silver particles, copper particles, silver oxide particles, copper oxide particles, and/or the like. Pre-sintering layer 11 may comprise a single type of metal particles or it may comprise two or more types thereof. It is preferred that the metal particles have a property such that they become a sintered body when temperature is increased from 80° C. to 300° C. at a temperature rise rate of 1.5° C./second and is held at 300° C. for 2.5 minutes. It is preferred that average diameter of crystallites at the metal particles be not less than 0.01 nm, more preferred that this be not less than 0.1 nm, and still more preferred that this be not less than 0.5 nm. The upper limit of the range in values for the average diameter of the crystallites might, for example, be 60 nm, it being preferred that this be 50 nm, and it being more preferred that this be 45 nm. The smaller the crystallite diameter the greater will be the tendency for the sintering temperature to be reduced.

The lower limit of the range in values for the average particle diameter of the metal particles might, for example, be 0.05 nm, 0.1 nm, or 1 nm. The upper limit of the range in values for the average particle diameter of the metal particles might, for example, be 1000 nm or 100 nm. D50 data obtained as a result of measurements in standard mode using a particle size analyzer (Microtrac HRA manufactured by Nikkiso Co., Ltd.) is taken to be the average particle diameter.

For every 100 wt % of pre-sintering layer 11, it is preferred that metal particles be present in an amount that is not less than 50 wt %, more preferred that this be not less than 60 wt %, and still more preferred that this be not less than 65 wt %. For every 100 wt % of pre-sintering layer 11 it is preferred that metal particles be present in an amount that is not greater than 98 wt %, more preferred that this be not greater than 97 wt %, and still more preferred that this be not greater than 95 wt %.

Pre-sintering layer 11 further comprises a binder that has a boiling point between 100° C. and 350° C. (hereinafter "low-boiling-point binder"). Pentanol, hexanol, heptanol, octanol, 1-decanol, ethylene glycol, diethylene glycol, propylene glycol, butylene glycol, α-terpineol, 1,6-hexanediol, isobornyl cyclohexanol (MTPH), and other such monohydric and polyhydric alcohols, ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, tripropylene glycol dimethyl ether, and other such ethers, ethylene glycol ethyl ether acetate, ethylene glycol butyl ether acetate, diethylene glycol ethyl ether acetate, diethylene glycol butyl ether acetate, dipropylene glycol methyl ether acetate (DPMA), and so forth may be cited as examples. Note that two or more of these may be used in combination. Of these, it is preferred that two species having different boiling points be used in combination. Employment of two species having different boiling points is superior in terms of ability to maintain sheet-like shape.

A method such as one in which a varnish containing pyrolizable binder, metal particles, and so forth is prepared; a support body is coated with the varnish; and the varnish is dried might be employed to obtain pre-sintering layer 11. The solvent for the varnish might, for example, be methyl ethyl ketone.

It is preferred that thickness of adhesive layer 122 be not less than 3 μm, and more preferred that this be not less than 5 μm. It is preferred that thickness of adhesive layer 122 be not greater than 50 μm, and more preferred that this be not greater than 30 μm.

Adhesive layer 122 is formed from adhesive. The adhesive might, for example, acrylic adhesive and/or rubber-type adhesive. Of these, acrylic adhesive is preferred. The acrylic adhesive might, for example, be an acrylic adhesive in which the base polymer thereof is an acrylic polymer (homopolymer or copolymer) employing one, two, or more varieties of (meth)acrylic acid alkyl ester as monomer component(s).

It is preferred that thickness of base 121 be 50 μm to 150 μm. It is preferred that base 121 have a property such that an energy beam is transmitted therethrough.

It is preferred that thickness of release liner 13 be 20 μm to 75 μm, and more preferred that this be 25 μm to 50 μm. As release liner 13, polyethylene terephthalate (PET) film and the like may be cited as examples.

—Power Module Manufacturing Method—

Figure 3:
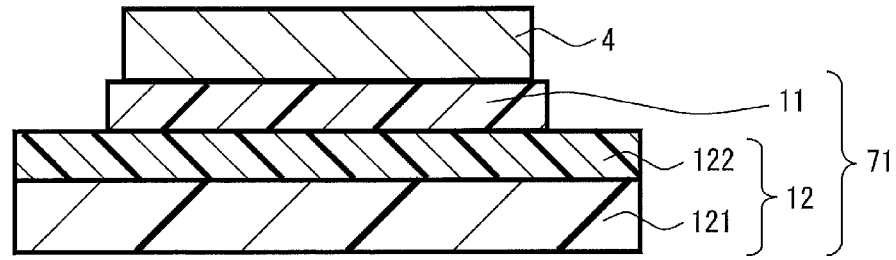
FIG. 3 Schematic sectional diagram showing an operation for manufacturing a power module.

As shown in FIG. 3, sheet 71 is affixed to semiconductor wafer 4. Semiconductor wafer 4 might, for example, be a silicon wafer, silicon carbide wafer, gallium nitride wafer, or the like. Affixing might, for example, be carried out at 70° C. to 80° C.

Figure 4:
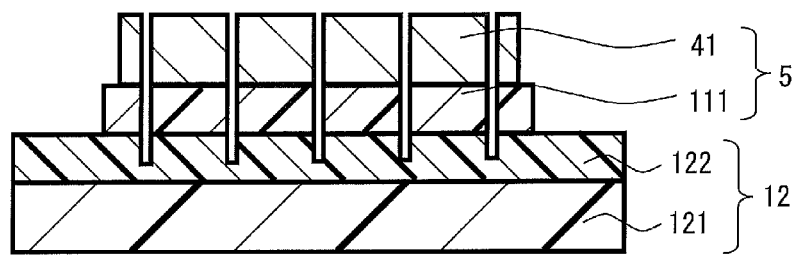
FIG. 4 Schematic sectional diagram showing an operation for manufacturing a power module.

As shown in FIG. 4, pre-sintering chips 5 are formed as a result of dicing of semiconductor wafer 4. Pre-sintering chip 5 comprises semiconductor chip 41 and pre-sintering film 111 which is arranged over semiconductor chip 41.

Pick-up of pre-sintering chip 5 is carried out. That is, needle(s) are used to push up pre-sintering chip 5, grab it, and remove it from adhesive layer 122.

Figure 5:
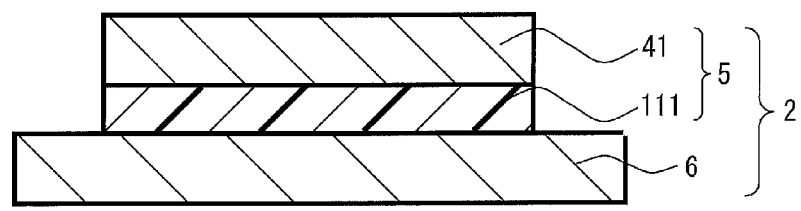
FIG. 5 Schematic sectional diagram showing an operation for manufacturing a power module.

As shown in FIG. 5, pre-sintering composite body 2 is obtained as a result of compression-bonding of pre-sintering chip 5 to bonding target 6. Compression-bonding might, for example, be carried out at 80° C. to 100° C. Bonding target 6 might, for example, be a substrate, lead frame, interposer, TAB film, semiconductor, or the like. Pre-sintering composite body 2 comprises bonding target 6, semiconductor chip 41, and pre-sintering film 111 which is sandwiched between bonding target 6 and semiconductor chip 41.

Sintering of pre-sintering film 111 is carried out. That is, pre-sintering composite body 2 is heated while a force is applied to pre-sintering composite body 2 by means of plate(s) to cause pre-sintering film 111 to become a sintered body. The lower limit of the range in values for the sintering temperature might, for example, be 200° C. or 250° C. The upper limit of the range in values for the sintering temperature might, for example, be 320° C. or 350° C. The lower limit of the range in values for the pressure which is applied to pre-sintering composite body 2 might, for example, be 1 MPa or 5 MPa. The upper limit of the range in values for the pressure which is applied to pre-sintering composite body 2 might, for example, be 20 MPa or 30 MPa.

Figure 6:
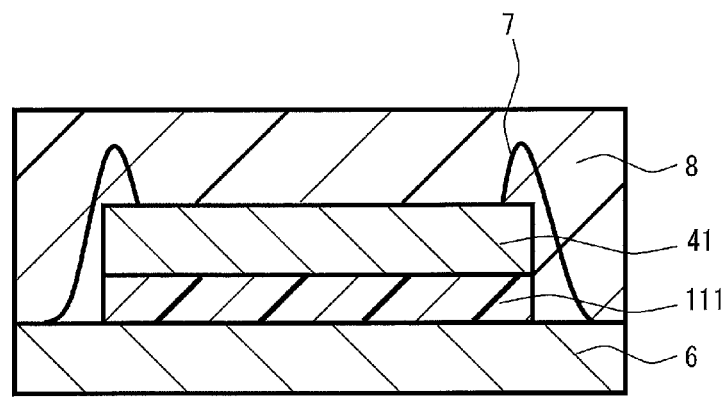
FIG. 6 Schematic sectional diagram showing an operation for manufacturing a power module.

As shown in FIG. 6, the electrode pads of semiconductor chip 41 and the terminal portions of bonding target 6 are electrically connected by means of bonding wire 7. Bonding wire 7 might, for example, be aluminum wire, gold wire, or copper wire.

Following wire bonding, semiconductor chips 41 are sealed with resin sealant 8. Following sealing, further heating may be carried out. This will make it possible to achieve complete curing of resin sealant 8 where this had been insufficiently carried out.

A power module obtained in accordance with the foregoing method comprises bonding target 6, semiconductor chip 41, and a sintered body which is sandwiched between bonding target 6 and semiconductor chip 41. The power module further comprises resin sealant 8 with which semiconductor chip 41 is covered.

As described above, a method for manufacturing a power module comprises Operation (a) in which sheet 71 is affixed to semiconductor wafer 4; Operation (b) in which pre-sintering chip 5 is formed as a result of dicing following Operation (a); Operation (c) in which pre-sintering chip 5 is compression-bonded to bonding target 6; and Operation (d) in which sintering of pre-sintering film 111 is carried out following Operation (c). Operation (d) comprises a step in which pre-sintering composite body 2 is heated.

A method for manufacturing a power module further comprises, following Operation (d), Operation (e) comprising a step in which a joint is formed between a first end of bonding wire 7 and semiconductor chip 41, and a step in which a joint is formed between a second end of bonding wire 7 and bonding target 6. A method for manufacturing a power module further comprises Operation (f) in which semiconductor chip 41 is sealed with resin sealant 8.

—Variation 1—

First portion 122A of adhesive layer 122 has a property such that it may be cured by means of an energy beam. Second portion 122B of adhesive layer 122 also has a property such that it may be cured by means of an energy beam. A method for manufacturing a power module further comprises, following Operation (b) in which pre-sintering chip 5 is formed, an operation in which adhesive layer 122 is irradiated with an energy beam and pick-up of pre-sintering chip 5 is carried out. Irradiating this with an energy beam facilitates pick-up of pre-sintering chip 5.

—Variation 2—

First portion 122A of adhesive layer 122 is cured by means of an energy beam. Second portion 122B of adhesive layer 122 is also cured by means of an energy beam.

—Variation 3—

Pre-sintering layer 11 constitutes a multilayer structure comprising a first layer and a second layer which is arranged over the first layer.

—Variation 4—

Figure 7:
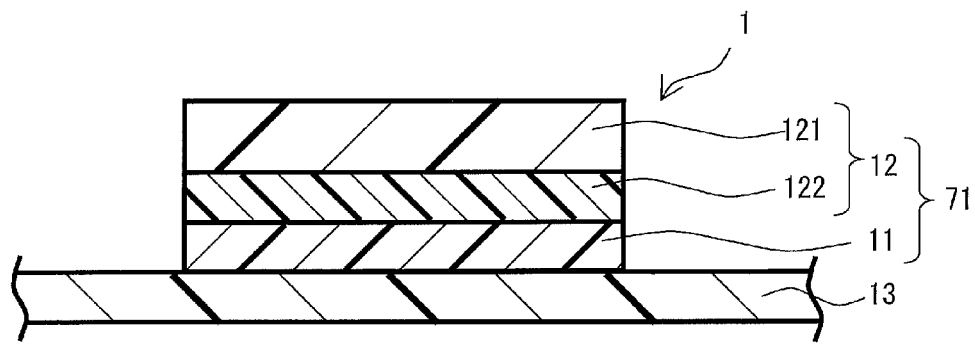
FIG. 7 Schematic sectional diagram of a portion of the composite sheet of Variation 4.

As shown in FIG. 7, the entire surface of one side of adhesive layer 122 is in contact with pre-sintering layer 11. Adhesive layer 122 has a property such that it may be cured by means of an energy beam. A method for manufacturing a power module further comprises, following Operation (b) in which pre-sintering chip 5 is formed, an operation in which adhesive layer 122 is irradiated with an energy beam and pick-up of pre-sintering chip 5 is carried out.

—Variation 5—

Figure 8:
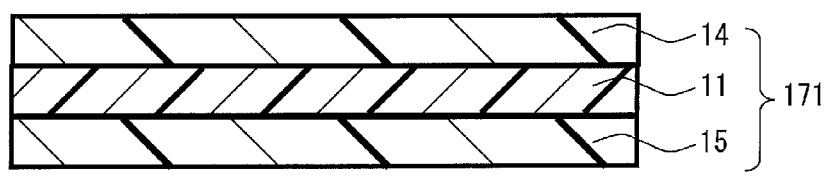
FIG. 8 Schematic sectional diagram showing the sheet of Variation 5.

As shown in FIG. 8, sheet 171 comprises pre-sintering layer 11. The two faces of pre-sintering layer 11 may be defined such that there is a first face and a second face opposite the first face. Sheet 171 further comprises first release liner 14 arranged over the first face and second release liner 15 arranged over the second face —Other Variations—

Any of Variation 1 through Variation 5 and/or the like may be combined as desired.

WORKING EXAMPLES

Although working examples are employed below to describe the present invention in more specific terms, it should be understood that the present invention, inasmuch as it does not go beyond the gist thereof, is not to be limited by the following working examples.

Raw Materials and so Forth for Pre-Sintering Sheet

Post-Adjustment ANP-1: ANP-1 manufactured by Applied Nanoparticle Laboratory Corporation (paste in which nano-sized silver microparticles are dispersed in binder) in which amount of solvent for adjustment of viscosity comprised thereby was adjusted as appropriate.

Copper microparticles: Copper microparticles of average particle diameter 200 nm and crystallite diameter 31 nm manufactured by Mitsui Mining & Smelting Co., Ltd.

MM-2002-1: MM-2002-1 manufactured by Fujikura Kasei Co., Ltd. (acrylic polymer) QPAC40: QPAC40 manufactured by Empower (polypropylene carbonate of weight-average molecular weight 50,000 to 350,000)

Tersorb MTPH: Tersorb MTPH manufactured by Nippon Terpene Chemicals, Inc. (high-viscosity terpenic alcohol)

Fabrication of Pre-Sintering Sheet

Respective components and methyl ethyl ketone were placed in the agitation vessel of a hybrid mixer (HM-500 manufactured by Keyence Corporation) as listed at TABLE 1 and made to undergo agitation for 8 minutes at 2000 rpm to obtain a varnish. The varnish was used to coat mold-release-treated film (MRA38 manufactured by Mitsubishi Plastics, Inc.). This was dried for 3 minutes at 110° C. to obtain a pre-sintering sheet. Thicknesses of pre-sintering sheets are shown at TABLE 1.

TABLE 1

| | | Pre-Sintering Sheet A | Pre-Sintering Sheet B | Pre-Sintering Sheet C | Pre-Sintering Sheet D | Pre-Sintering Sheet E | Pre-Sintering Sheet F | Pre-Sintering Sheet G | Pre-Sintering Sheet H | Pre-Sintering Sheet I |
|---|---|---|---|---|---|---|---|---|---|---|
| Amount | Post-Adjustment ANP-1 parts by weight | 100 | 100 | 100 | 100 | 100 | 100 | 100 | — | 100 |
| | Copper microparticles parts by weight | — | — | — | — | — | — | — | 100 | — |
| | MM-2002-1 parts by weight | 1 | 1 | — | 1 | 10 | 1 | 15 | — | 13 |
| | QPAC40 parts by weight | — | — | 1 | — | — | — | — | 14 | — |
| | Tersorb MTPH parts by weight | — | — | — | — | — | — | — | 9 | — |
| | Thickness μm | 30 | 50 | 50 | 80 | 50 | 20 | 50 | 80 | 50 |

Bonding Agent Used at Comparative Examples 4 and 5

MAX102 manufactured by Nihon Handa Co., Ltd. (paste-like bonding agent)

Evaluation 1: Viscosity at 90° C.

Viscosity of bonding agent (Pre-Sintering Sheets A through I, MAX 102, and Post-Adjustment ANP-1) was measured using a MARS III manufactured by HAAKE with a gap of 300 μm, a diameter of 8 mm, a strain of 0.05%, and a frequency of 1 Hz. Results are shown in TABLE 2.

Evaluation 2-1: Thickness/Reliability; Working Examples 1-7 and Comparative Examples 1-2

A chip was prepared that had a silicon chip of thickness 350 μm, length 5 mm, and width 5 mm; an Ag film of thickness 100 nm; and a Ti film of thickness 50 nm sandwiched between the silicon chip and the Ag film. A pre-sintering sheet was affixed to the Ag film of the chip under conditions of 70° C., 0.3 MPa, and 10 mm/sec to fabricate a pre-sintering-sheet-bearing chip. The pre-sintering-sheet-bearing chip was arranged over an Ag-plated Cu substrate which had a Cu substrate of thickness 3 mm and an Ag film of thickness 5 μm that covered the entirety of the Cu substrate. A sintering apparatus (HTM-3000 manufactured by Halo to Co., Ltd.) was used to carry out sintering, causing a joint to be formed between the Ag-plated Cu substrate and the chip. More specifically, a joint was formed by using a flat press to apply a pressure of 10 MPa as temperature was increased from 80° C. to 300° C. at a temperature rise rate of 1.5° C./second, and to apply a pressure of 10 MPa as this was maintained at 300° C. for 2.5 minutes. Note that sintering was carried out in a nitrogen atmosphere only for Working Example 6.

The sample obtained as a result of formation of the joint between the Ag-plated Cu substrate and the chip had the Ag-plated Cu substrate, the chip, and a sintered body sandwiched between the Ag-plated Cu substrate and the chip. Thickness of the sintered body, i.e., post-sintering thickness, was measured. Results are shown in TABLE 2.

Samples were subjected to 100 cycles of temperature variation using a thermal shock test apparatus (TSE-103ES manufactured by Espec Corp.). Each cycle consisted of a first time period during which temperature was maintained at −40° C. for 15 minutes and a second time period during which temperature was maintained at 125° C. for 15 minutes. After 100 cycles, an ultrasonic imaging apparatus (FineSAT II manufactured by Hitachi Kenki FineTech Co., Ltd.) was used to observe the samples. A PQ-50-13: WD (frequency 50 MHz) probe was used. Area of the portion of the joint which remained in the image that was obtained (hereinafter "remaining area") was determined. Taking total area to be 100%, the fractional remaining area was calculated. Fractional remaining area was evaluated as GOOD if it was greater than or equal to 50%. This was evaluated as BAD if it was lower than 50%. Results are shown in TABLE 2.

Evaluation 2-2: Thickness/Reliability; Comparative Example 4

A bonding agent layer was formed over Ag-plated Cu substrate by applying a coating of MAX102 thereto. Thickness of the bonding agent layer was measured. Following measurement of thickness, the solvent in the boding agent was volatilized for 30 min at 150° C. A chip was arranged over the bonding agent layer. Sintering was carried out under the same conditions as at Working Example 1 to cause a joint to be formed between the Ag-plated Cu substrate and the chip. Thickness of the sintered body was measured. The sample was subjected to the same temperature variation as at Working Example 1, and reliability was evaluated. Results are shown in TABLE 2.

Evaluation 2-3: Thickness/Reliability; Comparative Example 5

Except for the fact that the step in which the solvent was volatilized was omitted, thickness and reliability were evaluated using the same method as at Comparative Example 4. Results are shown in TABLE 2.

Evaluation 3: Silver Microparticle or Copper Microparticle Content

Silver microparticle or copper microparticle content was determined by means of TG-DTA when temperature was increased to 500° C. at a temperature rise rate of 10° C./min. When determining copper microparticle content, TG-DTA was carried out in a nitrogen atmosphere.
Results are shown in TABLE 2.

TABLE 2

| | | Working Example 1 | Working Example 2 | Working Example 3 | Working Example 4 | Working Example 5 | Working Example 6 | Comparative Example 1 |
|---|---|---|---|---|---|---|---|---|
| | Bonding agent | Pre-Sintering Sheet A | Pre-Sintering Sheet B | Pre-Sintering Sheet C | Pre-Sintering Sheet D | Pre-Sintering Sheet E | Pre-Sintering Sheet H | Pre-Sintering Sheet F |
| Evaluation | Amount in wt % of silver microparticles within 100 wt % of bonding agent | 94 | 94 | 94 | 94 | 85 | — | 94 |
| | Amount in wt % of copper microparticles within 100 wt % of bonding agent | — | — | — | — | — | 85 | — |
| | Viscosity at 90° C. MPa · s | 3.2 | 3.2 | 6.1 | 3.2 | 0.55 | 0.28 | 3.2 |
| | Pre-sintering thickness μm | 30 | 50 | 50 | 80 | 50 | 80 | 20 |
| | Post-sintering thickness μm | 18 | 30 | 30 | 50 | 30 | 40 | 10 |
| | Reliability | GOOD | GOOD | GOOD | GOOD | GOOD | GOOD | BAD |

| | | Comparative Example 2 | Comparative Example 3 | Comparative Example 4 | Comparative Example 5 | Working Example 7 |
|---|---|---|---|---|---|---|
| | Bonding agent | Pre-Sintering Sheet G | Post-Adjustment ANP-1 | MAX102 | MAX102 | Pre-Sintering Sheet I |
| Evaluation | Amount in wt % of silver microparticles within 100 wt % of bonding agent | 81 | 90 | 91 | 91 | 83 |

TABLE 2-continued

|  |  |  |  |  |  |
|---|---|---|---|---|---|
| Amount in wt % of copper microparticles within 100 wt % of bonding agent | — | — | — | — | — |
| Viscosity at 90° C. MPa·s | 0.23 | 1.0 | 0.26 | 0.26 | 0.3 |
| Pre-sintering thickness μm | 50 | — | 50 | 50 | 50 |
| Post-sintering thickness μm | 10 | — | 30 | 10 | 25 |
| Reliability | BAD | — | BAD | BAD | GOOD |

At Comparative Example 5—the example in which MAX102 was used to form a bonding agent layer, and sintering was carried out without the solvent having been volatilized—there was a large decrease in thickness as a result of sintering. This is thought to have been due to the fact that the solvent was not volatilized prior to sintering. To suppress the decrease in thickness of the bonding agent layer formed by MAX102, it would be necessary to volatilize the solvent. Reliability was also poor.

Comparative Example 4—the example in which MAX102 was used to form a bonding agent layer, and solvent was volatilized—was poor in terms of ease of operations. This is because there was a step in which the solvent was volatilized. The sintered body formed at Comparative Example 4 might have had defects resulting from nonuniformity in drying. This is because a large amount of solvent was volatilized. And it was also the case that reliability was not good.

At Comparative Example 3—the example in which Post-Adjustment ANP-1 was used—a bonding agent layer could not be formed. This is because the viscosity of Post-Adjustment ANP-1 was too high.

There was less change in thickness at Working Examples 2, 3, and 5 than at Comparative Example 2. This is likely due to the fact there was little flow during sintering. Post-sintering thickness at Working Example 2 was greater than that at Comparative Example 1. This is likely due to the fact that pre-sintering thickness at Working Example 2 was greater than that at Comparative Example 1. Working Examples 1 through 5 also had good reliability.

REFERENCE CHARACTERS LIST

1 Composite sheet
11 Pre-sintering layer
12 Dicing sheet
13 Release liner
71 Sheet
121 Base
122 Adhesive layer
122A First portion
122B Second portion
2 Pre-sintering composite body
4 Semiconductor wafer
5 Pre-sintering chip
41 Semiconductor chip
111 Pre-sintering film
6 Bonding target
7 Bonding wire
8 Resin sealant
171 Sheet
14 First release liner
15 Second release liner

The invention claimed is:

1. A sheet comprising:
a pre-sintering layer;
a first release liner arranged over a first face of the pre-sintering layer; and
a second release liner arranged over a second face of the pre-sintering layer,
wherein the second face is provided opposite the first face;
wherein thickness of the pre-sintering layer is 30 μm to 200 μm;
wherein a viscosity at 90° C. of the pre-sintering layer is not less than 0.27 MPa·s;
wherein the pre-sintering layer comprises metal particles;
wherein the metal particles comprise at least one species selected from the group consisting of silver particles, copper particles, silver oxide particles, and copper oxide particles;
wherein the metal particles are present in an amount that is 50 wt % to 98 wt % per 100 wt % of the pre-sintering layer;
wherein the metal particles become a sintered body when temperature is increased from 80° C. to 300° C. at a temperature rise rate of 1.5° C./second and is held at 300° C. for 2.5 minutes;
wherein the pre-sintering layer further comprises a binder which is solid at 23° C., wherein the binder comprises acrylic polymer and/or polycarbonate;
wherein the binder is present in an amount that is 0.5 wt % to 20 wt % per 100 wt % of the pre-sintering layer; and
wherein the pre-sintering layer further comprises at least one low-boiling-point binder which has a boiling point between 100° C. and 350° C. selected from the group consisting of monohydric alcohols, polyhydric alcohols, and ethers.

2. The sheet according to claim 1,
wherein, when a pre-sintering laminated body having a substrate, a chip, and the pre-sintering layer sandwiched between the substrate and the chip is heated under Condition 1, below, to cause the pre-sintering layer to become the sintered body, a thickness of the sintered body is 40% to 80% where a thickness of the pre-sintering layer is taken to be 100%;
wherein Condition 1 is that a flat press is used to apply a pressure of 10 MPa to the pre-sintering laminated body as temperature is increased 1.5° C./second from 80° C. to 300° C., and to apply the pressure as 300° C. is maintained for 2.5 minutes.

3. The sheet according to claim 1,
wherein the pre-sintering layer is used to form a joint between a first object and a second object.

4. The sheet according to claim 1,
wherein the binder has a property such that a carbon concentration of the binder is not greater than 15 wt % following an increase in temperature from 23° C. to 400° C. at a temperature rise rate of 10° C./min in air.

5. The sheet according to claim 1, wherein an average particle diameter of the metal particles is not greater than 1000 nm.

6. The sheet according to claim 1, wherein an average particle diameter of the metal particles is not greater than 100 nm.

7. The sheet according to claim 1 wherein the binder comprises polycarbonate, and wherein the polycarbonate is aliphatic polycarbonate.

8. The sheet according to claim 1 wherein the binder comprises polycarbonate, and wherein the polycarbonate is polypropylene carbonate.

9. The sheet according to claim 1 wherein the binder comprises polycarbonate, and wherein the polycarbonate has a property such that carbon concentration is not greater than 15 wt % following an increase in temperature from 23° C. to 400° C. at a temperature rise rate of 10° C./min in air.

10. The sheet according to claim 1 wherein the low-boiling-point binder is at least one compound selected from the group consisting of: pentanol, hexanol, heptanol, octanol, 1-decanol, ethylene glycol, diethylene glycol, propylene glycol, butylene glycol, alpha-terpineol, 1,6-hexanediol, isobornyl cyclohexanol (MTPH), and the ethers.

11. The sheet according to claim 1 wherein the low-boiling-point binder is isobornyl cyclohexanol (MTPH).

12. A sheet comprising a pre-sintering layer; and
a dicing sheet arranged over the pre-sintering layer;
wherein thickness of the pre-sintering layer is 30 μm to 200 μm;
wherein a viscosity at 90° C. of the pre-sintering layer is not less than 0.27 MPa·s;
wherein the pre-sintering layer comprises metal particles;
wherein the metal particles comprise at least one species selected from the group consisting of silver particles, copper particles, silver oxide particles, and copper oxide particles;
wherein the metal particles are present in an amount that is 50 wt % to 98 wt % per 100 wt % of the pre-sintering layer;
wherein the metal particles become a sintered body when temperature is increased from 80° C. to 300° C. at a temperature rise rate of 1.5° C./second and is held at 300° C. for 2.5 minutes;
wherein the pre-sintering layer further comprises a binder which is solid at 23° C., wherein the binder comprises acrylic polymer and/or polycarbonate;
wherein the binder is present in an amount that is 0.5 wt % to 20 wt % per 100 wt % of the pre-sintering layer; and
wherein the pre-sintering layer further comprises at least one low-boiling-point binder which has a boiling point between 100° C. and 350° C. selected from the group consisting of monohydric alcohols, polyhydric alcohols, and ethers.

13. A composite sheet comprising:
a release liner; and
the sheet according to claim 12 arranged over the release liner.

14. The sheet according to claim 12,
wherein the binder comprises the polycarbonate; and
wherein the polycarbonate is polypropylene carbonate.

15. The sheet according to claim 12,
wherein the binder comprises the polycarbonate; and
wherein the polycarbonate has a property such that carbon concentration is not greater than 15 wt % following an increase in temperature from 23° C. to 400° C. at a temperature rise rate of 10° C./min in air.

16. The sheet according to claim 12, wherein the low-boiling-point binder is at least one compound selected from the group consisting of: pentanol, hexanol, heptanol, octanol, 1-decanol, ethylene glycol, diethylene glycol, propylene glycol, butylene glycol, alpha-terpineol, 1,6-hexanediol, isobornyl cyclohexanol (MTPH), and the ethers.

17. The sheet according to claim 12, wherein the low-boiling-point binder is isobornyl cyclohexanol (MTPH).

18. The sheet according to claim 12, wherein the viscosity at 90° C. of the pre-sintering layer is not less than 0.3 MPa·s.

19. The sheet according to claim 12, wherein the viscosity at 90° C. of the pre-sintering layer is not less than 0.5 MPa·s.

20. The sheet according to claim 1, wherein the viscosity at 90° C. of the pre-sintering layer is not less than 0.3 MPa·s.

21. The sheet according to claim 1, wherein the viscosity at 90° C. of the pre-sintering layer is not less than 0.5 MPa·s.

* * * * *